(12) United States Patent
Pan (10) Patent No.: US 12,501,704 B2
(45) Date of Patent: Dec. 16, 2025

(54) ARRAY SUBSTRATE AND DISPLAY PANEL (71) Applicant: WUHAN CHINA STAR OPTOELECTRONICS TECHNOLOGY CO., LTD., Hubei (CN)

(72) Inventor: You Pan, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 692 days.

(21) Appl. No.: 17/618,468

(22) PCT Filed: Nov. 23, 2021

(86) PCT No.: PCT/CN2021/132450
§ 371 (c)(1),
(2) Date: Dec. 11, 2021

(87) PCT Pub. No.: WO2023/070789
PCT Pub. Date: May 4, 2023

(65) Prior Publication Data
US 2024/0014220 A1   Jan. 11, 2024

(30) Foreign Application Priority Data
Nov. 1, 2021   (CN) .......................... 202111281823.2

(51) Int. Cl.
*H10D 86/60* (2025.01)
*G02F 1/1362* (2006.01)
(Continued)

(52) U.S. Cl.
CPC ....... *H10D 86/60* (2025.01); *G02F 1/136209* (2013.01); *G02F 1/136286* (2013.01); *G02F 1/1368* (2013.01); *H10D 86/441* (2025.01)

(58) Field of Classification Search
CPC ............. H01L 27/124; H01L 29/78633; G02F 1/136209; G02F 1/136286; G02F 1/1368; G02F 1/13685; G02F 1/133512
See application file for complete search history.

(56) References Cited

U.S. PATENT DOCUMENTS 6,380,559 B1 *   4/2002   Park ...................... H01L 27/124
                                                    257/E29.147
2012/0104406 A1   5/2012   Inoue et al.
(Continued)

FOREIGN PATENT DOCUMENTS

CN     104218092 A    12/2014
CN     204204858 U     3/2015
(Continued)

OTHER PUBLICATIONS

International Search Report in International application No. PCT/CN2021/132450, mailed on Jul. 27, 2022.
(Continued)

*Primary Examiner* — Fernando L Toledo
*Assistant Examiner* — Marshall Mu-Nuo Hatfield
(74) *Attorney, Agent, or Firm* — PV IP PC; Peter S. Stecher; Wei Te Chung (57) ABSTRACT

An array substrate comprises a base substrate, a light-shielding layer disposed on the base substrate, and a plurality of transistors disposed in an array on a side of the light-shielding layer away from the base substrate. The light-shielding layer comprises a plurality of light-shielding portions. Orthographic projections of a source terminal of each of the transistors and a drain terminal of one adjacent transistor in a same row on the base substrate are located on one same light-shielding portion, and orthographic projections of a source terminal and a drain terminal of one same transistor on the base substrate are respectively located on
(Continued)

two adjacent light-shielding portions that are spaced apart. A display panel comprises the array substrate.

14 Claims, 4 Drawing Sheets

(51) Int. Cl.
*G02F 1/1368* (2006.01)
*H10D 86/40* (2025.01)

(56) References Cited

U.S. PATENT DOCUMENTS

| | | | |
|---|---|---|---|
| 2015/0028341 A1 | 1/2015 | Sun et al. | |
| 2018/0373106 A1* | 12/2018 | Nagasawa | G02F 1/1343 |
| 2021/0233988 A1* | 7/2021 | Wei | H10K 59/131 |

FOREIGN PATENT DOCUMENTS

| | | | |
|---|---|---|---|
| CN | 105679768 A | | 6/2016 |
| CN | 205657056 U | * | 10/2016 |
| CN | 106328714 A | | 1/2017 |
| CN | 106444197 A | | 2/2017 |
| CN | 107170829 A | | 9/2017 |
| CN | 206773360 U | | 12/2017 |
| CN | 112447760 A | | 3/2021 |
| CN | 113050335 A | | 6/2021 |
| JP | 2003229578 A | | 8/2003 |

OTHER PUBLICATIONS

Written Opinion of the International Search Authority in International application No. PCT/CN2021/132450, mailed on Jul. 27, 2022.

Chinese Office Action issued in corresponding Chinese Patent Application No. 202111281823.2 dated Jun. 6, 2022, pp. 1-7.

* cited by examiner

ARRAY SUBSTRATE AND DISPLAY PANEL

FIELD OF INVENTION

The present disclosure relates to the technical field of display, and particularly to an array substrate and a display panel.

BACKGROUND

With the development of display technology, liquid crystal display (LCD) panels and organic light emitting display (OLED) panels have been widely used. For a liquid crystal display panel using low-temperature polysilicon (LTPS), a light-shielding (LS) layer is usually added to a channel of a thin-film transistor (TFT) to reduce light-induced leakage current, but the light-shielding layer cannot completely eliminate the leakage current. The leakage current will cause pixel voltage fluctuation, thereby changing pixel brightness and causing abnormal flicker of the display panel.

SUMMARY OF DISCLOSURE

The present disclosure provides an array substrate and a display panel to solve the technical problem of abnormal flicker of current display panels.

In order to solve the above technical problem, the present disclosure provides the following technical solutions.

The present disclosure provides an array substrate comprising:
 a base substrate;
 a light-shielding layer disposed on the base substrate and comprising a plurality of light-shielding portions disposed at intervals;
 a plurality of transistors disposed in an array on a side of the light-shielding layer away from the base substrate, wherein each of the transistors comprises an active layer, the active layer comprises a source terminal and a drain terminal disposed at intervals, orthographic projections of the source terminal of each of the transistors and the drain terminal of one adjacent transistor in a same row on the base substrate are located on one same light-shielding portion, and orthographic projections of the source terminal and the drain terminal of one same transistor on the base substrate are respectively located on two adjacent light-shielding portions that are spaced apart.

In an embodiment, the transistors in each row further comprise a gate line disposed on a side of the active layers away from the light-shielding layer and extending in a first direction. Each active layer comprises a first active portion and a second active portion disposed at intervals and extending in a second direction, and a third active portion connecting the first active portion and the second active portion. A region of the first active portion corresponding to the gate line is formed as a first channel. A region of the second active portion corresponding to the gate line is formed as a second channel.

In an embodiment, the source terminal is located at the first active portion and a side of the first channel away from the third active portion, and the drain terminal is located at the second active portion and a side of the second channel away from the third active portion.

In an embodiment, the first channel of each of the transistors and the second channel of the adjacent transistor in the same row correspond to one same light-shielding portion.

In an embodiment, orthographic projections of the first channel of each of the transistors and the second channel of the adjacent transistor in the same row on the base substrate are located within an orthographic projection of the light-shielding portion on the base substrate.

In an embodiment, each of the light-shielding portions comprises a first light-shielding sub-portion, a second light-shielding sub-portion, and a third light-shielding sub-portion connecting the first light-shielding sub-portion and the second light-shielding sub-portion. The first light-shielding sub-portion is disposed corresponding to the source terminal and the first channel. The second light-shielding sub-portion is disposed corresponding to the drain terminal and the second channel.

In an embodiment, a width of the third light-shielding sub-portion in the second direction is less than a width of the first light-shielding sub-portion and a width of the second light-shielding sub-portion in the second direction.

In an embodiment, an orthographic projection of each gate line on the base substrate does not overlap with an orthographic projection of one corresponding third light-shielding sub-portion on the base substrate.

In an embodiment, one of the first channel of each of the transistors and the second channel of the adjacent transistor in the same row is disposed corresponding to one light-shielding portion.

In an embodiment, each of the light-shielding portions comprises a first light-shielding sub-portion, a second light-shielding sub-portion, and a third light-shielding sub-portion connecting the first light-shielding sub-portion and the second light-shielding sub-portion. The first light-shielding sub-portion is disposed corresponding to the source terminal and the first channel. The second light-shielding sub-portion is disposed corresponding to the drain terminal.

The present disclosure further provides a display panel comprising the array substrate of one of the above embodiments.

The present disclosure provides an array substrate and a display panel comprising the same. The array substrate comprises a base substrate, a light-shielding layer disposed on the base substrate, and a plurality of transistors disposed in an array on a side of the light-shielding layer away from the base substrate. The light-shielding layer comprises a plurality of light-shielding portions disposed at intervals. Each of the transistors comprises an active layer, and the active layer comprises a source terminal and a drain terminal disposed at intervals. Orthographic projections of the source terminal of each of the transistors and the drain terminal of one adjacent transistor in a same row on the base substrate are located on one same light-shielding portion. Orthographic projections of the source terminal and the drain terminal of one same transistor on the base substrate are respectively located on two adjacent light-shielding portions that are spaced apart. In this way, a voltage jump at the source terminal of each transistor will cause a voltage jump at one corresponding light-shielding portion. The voltage jump at the corresponding light-shielding portion will be coupled to the drain terminal of one adjacent transistor. This increases an absolute value of a voltage of the drain terminal of the adjacent transistor to compensate for a decrease in a voltage at the drain terminal due to leakage current, thereby increasing pixel brightness and solving the technical problem of abnormal flicker of display panels caused by leakage current of transistors.

BRIEF DESCRIPTION OF DRAWINGS

In order to more clearly illustrate technical solutions in embodiments or the prior art, a brief description of accompanying drawings used in a description of the embodiments or the prior art will be given below. Obviously, the accompanying drawings in the following description are merely some embodiments of the present invention. For those skilled in the art, other drawings may be obtained from these accompanying drawings without creative labor.

DETAILED DESCRIPTION

The following description of various embodiments of the present disclosure with reference to the accompanying drawings is used to illustrate specific embodiments that can be practiced. Directional terms mentioned in the present disclosure, such as "above", "below", "front", "back", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structures are indicated by the same reference numerals. In the accompanying drawings, thicknesses of some layers and regions are exaggerated for clear understanding and ease of description. That is, a size and thickness of each component shown in the accompanying drawings are arbitrarily shown, but the present application is not limited thereto.

Figure 1:
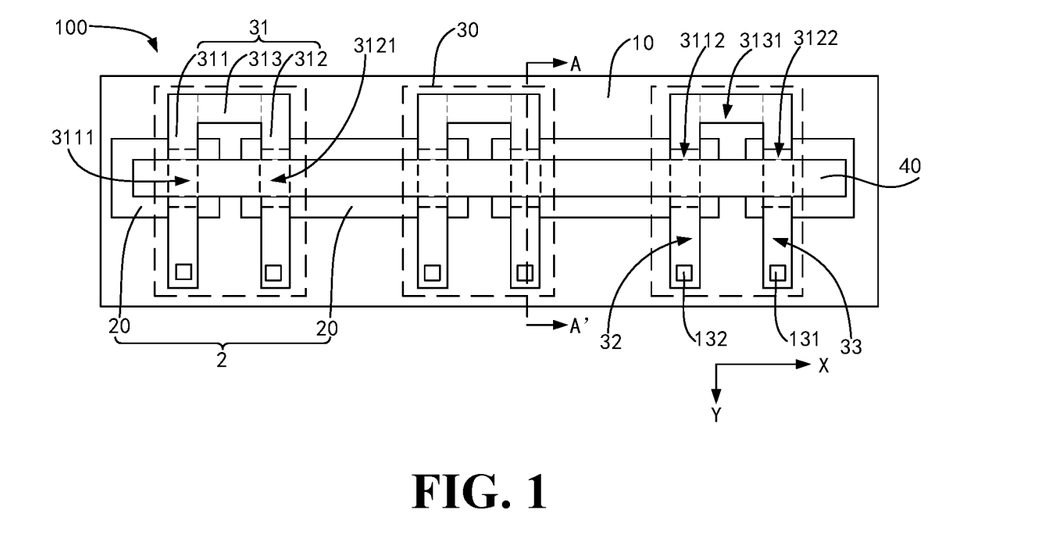
FIG. 1 is a schematic top view of an array substrate according to an embodiment of the present disclosure.
Figure 2:
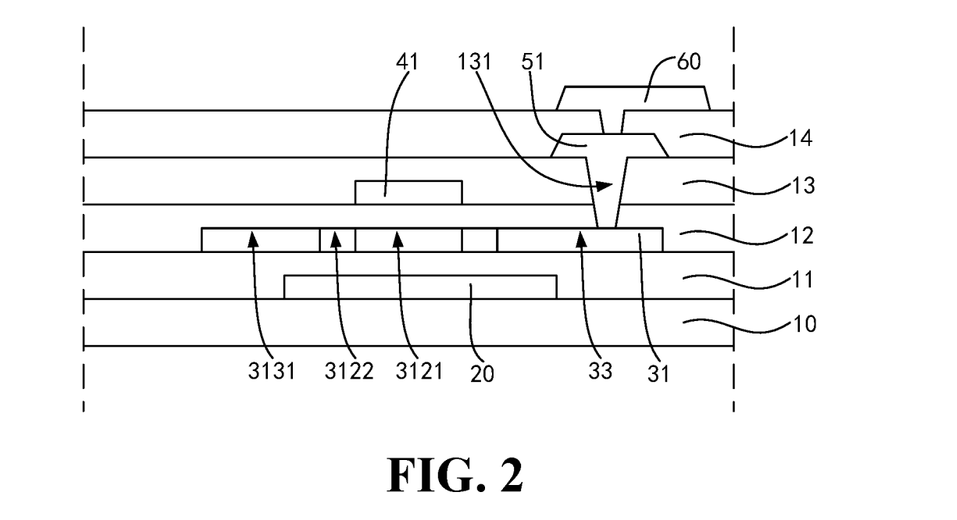
FIG. 2 is a schematic cross-sectional view of the array substrate of FIG. 1 along a line A-A'.
Figure 3:
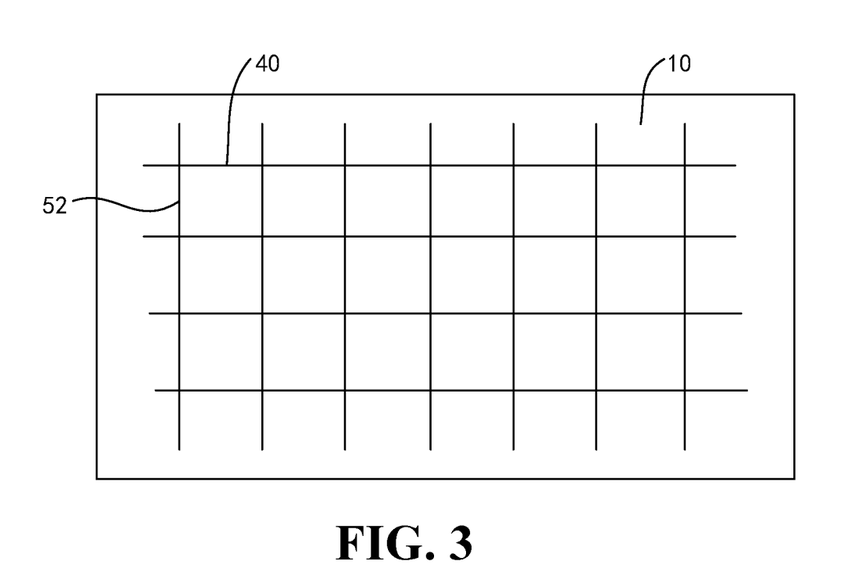
FIG. 3 is a schematic diagram of arrangement of data lines and gate lines on the array substrate according to an embodiment of the present disclosure.

Please refer to FIG. 1 to FIG. 3. FIG. 1 is a schematic top view of an array substrate 100 according to an embodiment of the present disclosure. FIG. 2 is a schematic cross-sectional view of the array substrate 100 of FIG. 1 along a line A-A'. FIG. 3 is a schematic diagram of an arrangement of data lines 52 and gate lines 40 on the array substrate 100 according to an embodiment of the present disclosure. The array substrate 100 comprises a base substrate 10, a light-shielding layer 2, and a plurality of transistors 30. The light-shielding layer 2 is disposed on the base substrate 10. The light-shielding layer 2 comprises a plurality of light-shielding portions 20 disposed at intervals. The transistors 30 are disposed in an array on a side of the light-shielding layer 2 away from the base substrate 10. Each of the transistors 30 comprises an active layer 31, and the active layer 31 comprises a source terminal 32 and a drain terminal 33 disposed at intervals. Orthographic projections of the source terminal 32 of each of the transistors 30 and the drain terminal 33 of one adjacent transistor 30 in a same row on the base substrate 10 are located on one same light-shielding portion 20. Orthographic projections of the source terminal 32 and the drain terminal 33 of one same transistor 30 on the base substrate 10 are respectively located on two adjacent light-shielding portions 20 that are spaced apart.

Specifically, the transistors 30 in each row further comprise a gate lines 40 disposed on a side of the active layers 31 away from the light-shielding layer 2 and extending in a first direction X. The gate line 40 is configured to provide a switching signal to the transistors 30. Each active layer 31 comprises a first active portion 311 and a second active portion 312 disposed at intervals and extending in a second direction Y, and a third active portion 313 connecting the first active portion 311 and the second active portion 312. As shown in FIG. 1, the three active portions of the active layer 31 are separated by two dotted lines extending in the second direction Y for schematic distinction. The three active portions of the active layer 31 make an entirety of the active layer 31 U-shaped. The U-shaped active layer 31 makes each of the transistors 30 equivalent to two thin-film transistors (TFTs) formed in series, which can effectively reduce leakage current of the transistors 30. However, the present application is not limited to this. The active layer 31 of the present application may also be of other types, so that each of the transistors 30 is equivalent to a single or multiple thin-film transistors. The first direction X is a horizontal direction, and the second direction Y is a vertical direction. However, the present application is not limited to this. In the present application, the first direction X may be the vertical direction, and the second direction Y may be the horizontal direction. Moreover, other included angles may be formed between the first direction X and the second direction Y.

A region of the first active portion 311 corresponding to the gate line 40 is formed as a first channel 3111, and a region of the second active portion 312 corresponding to the gate line 40 is formed as a second channel 3121. As shown in FIG. 1, each channel of the active layer 31 is indicated by a dashed frame. The source terminal 32 is located at the first active portion 311 and a side of the first channel 3111 away from the third active portion 313. The drain terminal 33 is located at the second active portion 312 and a side of the second channel 3121 away from the third active portion 313.

Optionally, the active layer 31 may be made of a semiconductor material such as low-temperature polysilicon. The switching signal of the gate line 40 can turn on the first channel 3111 and the second channel 3121 of the active layer 31. Two parts of the first active portion 311 located on opposite sides of the first channel 3111 are formed as two first lightly doped regions 3112. Two parts of the second active portion 312 located on opposite sides of the second channel 3121 are formed as two second lightly doped regions 3122. The first lightly doped regions 3112 and the second lightly doped regions 3122 can reduce a turn-on field of the transistor 30 and reduce leakage current.

A part of the active layer 31 between the first lightly doped region 3112 and the second lightly doped region 3122 is a heavily doped region 3131. Furthermore, a part of the first active portion 311 on a side of the first lightly doped region 3112 away from the third active portion 313, and a part of the second active portion 312 on a side of the second lightly doped region 3122 away from the third active portion 313 are also heavily doped regions 3131. That is, all regions of the active layer 31 except for the first channel 3111, the second channel 3121, the first lightly doped regions 3112, and the second lightly doped regions 3122 are the heavily doped regions 3131. As shown in FIG. 1, the lightly doped regions and the heavily doped regions of the active layer 31 are separated by dotted lines extending in the first direction X for schematic distinction. Each of the heavily doped regions 3131 can form an ohmic contact between the active layer 31 and one corresponding metal trace. Each of the source terminal 32 and the drain terminal 33 corresponds to one heavily doped region 3131, so that each of the source terminal 32 and the drain terminal 33 forms an ohmic contact with one corresponding metal trace. For example, the source terminal 32 is connected to one data line 52. The data line 52 is configured to provide a source driving signal to the transistor 30 through the source terminal 32. The data line 52 may be disposed parallel to the second direction Y. The data lines 52 and the gate lines 40 are interlaced to define a plurality of pixels. The drain terminal 33 is connected to a drain electrode 51 and is configured to provide a driving voltage to one corresponding pixel.

A structure and positional relationship of each layer in the array substrate 100 will be described in detail below.

The light-shielding portions 20 are disposed on the base substrate 10. The light-shielding portions 20 are made of a metal such as Mo, Cu, or Cr, or made of other light-absorbing materials. The base substrate 10 may be a rigid substrate or a flexible substrate. When the base substrate 10 is a rigid substrate, it may be made of a glass substrate, a transparent resin material, or the like. When the base substrate 10 is a flexible substrate, it may be made of polyimide or the like.

A barrier layer 11 covers the light-shielding portions 20 and the base substrate 10, so as to prevent water and oxygen passing through the base substrate 10 from diffusing to components in the array substrate 100, prevent heavy metals of the light-shielding portions 20 from diffusing to the components in the array substrate 100, and keep the light-shielding portions 20 insulated from the other components in the array substrate 100. The barrier layer 11 is made of an inorganic material such as silicon oxide, silicon nitride, or silicon oxynitride, but is not limited thereto.

The transistors 30 are disposed on a side of the barrier layer 11 away from the light-shielding portions 20. Each of the transistors 30 comprises the active layer 31, a gate electrode 41, and source and drain electrodes. Because FIG. 2 is the schematic cross-sectional view of the array substrate 100 of FIG. 1 in a direction, FIG. 2 only shows the drain electrode 51 and a part of the active layer 31. Specifically, the active layer 31 is disposed on the barrier layer 11. The active layer 31 comprises the second channel 3121, the second lightly doped regions 3122 disposed on the opposite sides of the second channel 3121, and the heavily doped regions 3131 located on sides of the second lightly doped regions 3122 away from the second channel 3121. Orthographic projections of the second channel 3121, the second lightly doped regions 3122, and parts of the heavily doped regions 3131 on the base substrate 10 are located within an orthographic projection of the shading portion 20 on the base substrate 10, so that the light-shielding portion 20 shields the second channel 3121, thereby preventing light from irradiating the second channel 3121 through the base substrate 10 to cause light-induced leakage current.

A gate insulating layer 12 covers the active layer 31 and the barrier layer 11. The gate electrode 41 is disposed on the gate insulating layer 12. The gate electrode 41 is electrically connected to the gate line 40. The gate electrode 41 may be integrally disposed with the gate line 40. That is, the gate electrode 41 is a part of the gate line 40. The gate electrode 41 is disposed corresponding to the second channel 3121 of the active layer 31. When the gate line 40 provides a scan signal (that is, the aforementioned switching signal) to the gate electrode 41, the second channel 3121 is turned on, and the heavily doped regions 3131 located on the opposite sides of the second channel 3121 are turned on.

An interlayer insulating layer 13 covers the gate electrode 41 and the gate insulating layer 12. The source and drain electrodes are disposed on the interlayer insulating layer 13. FIG. 2 shows the drain electrode 51. The drain electrode 51 is electrically connected to the heavily doped region 3131 of the active layer 31 through a first via hole 131 of the interlayer insulating layer 13. The heavily doped region 3131 connected to the drain electrode 51 is the drain terminal 33 of the active layer 31.

It can be understood that the source electrode is also connected to the source terminal 32 of the active layer 31 through a second via hole 132 of the interlayer insulating layer 13. Furthermore, the data line 52 and the source and drain electrodes are disposed in a same layer. The data line 52 is electrically connected to the source electrode to provide a data signal to the source terminal 32 of the transistor 30. It should be noted that "are disposed in a same layer" in the present disclosure refers to that in a manufacturing process, a layer made of a same material is patterned into at least two different features, so that the at least two different features are disposed in a same layer. For example, in this embodiment, the drain electrode 51 and the data line 52 are formed by patterning a same conductive layer, so that the drain electrode 51 and the data line 52 are disposed in the same layer.

A planarization layer 14 covers the drain electrode 51 and the interlayer insulating layer 13. A pixel electrode 60 is disposed on the planarization layer 14. The pixel electrode 60 is connected to the drain electrode 51 through a via hole of the planarization layer 14. The pixel electrode 60 is configured to provide a driving signal to the pixel. Specifically, when the gate line 40 provides the scan signal to turn on the transistor 30, the data signal of the data line 52 is transmitted to the source terminal 32 of the active layer 31 through the source electrode. The source terminal 32 transmits the data signal to the drain terminal 33 through the first channel 3111 and the second channel 3121. The drain terminal 33 transmits the data signal to the pixel electrode 60 through the drain electrode 51. The array substrate 100 further comprises a storage capacitor. When the transistor 30 is turned on, the data signal is also written into the storage capacitor to charge the storage capacitor. When the transistor 30 is turned off, the storage capacitor can provide a driving signal to the pixel electrode 60. However, at this time, there is a voltage difference between the source terminal 32 and the drain terminal 33, so that the drain terminal 33 will inevitably leak current to the source terminal 32. Leakage current will weaken the driving signal provided to the pixel electrode 60, reduce pixel brightness, and cause abnormal flicker.

The light-shielding portions 20 of the present application can improve abnormal flicker. Specifically, the first channel 3111 of each of the transistors 30 and the second channel 3121 of the adjacent transistor 30 in a same row correspond to one same light-shielding portion 20, and orthographic projections of the first channel 3111 of each of the transistors 30 and the second channel 3121 of the adjacent transistor 30 in the same row on the base substrate 10 are located within an orthographic projection of the light-shielding portion 20 on the base substrate 10, so that the light-shielding portion 20 can completely shield the first channel 3111 and the second channel 3121.

Furthermore, the first channel 3111 and the second channel 3121 of one same transistor 30 respectively correspond to two different light-shielding portions 20. Specifically, in the same transistor 30, the orthographic projection of the first channel 3111 on the base substrate 10 is located on one light-shielding portion 20, the orthographic projection of the second channel 3121 on the base substrate 10 is located on another light-shielding portion 20, and the two light-shielding portions 20 are disposed adjacently and spaced apart.

A principle that the light-shielding portions 20 of the present application can improve the abnormal flicker will be described in detail below.

In the present disclosure, a driving mode of the pixels is a column inversion driving mode. That is, in a same frame, driving voltages of every two adjacent columns of pixels have opposite polarities. Taking a L127 grayscale image as an example, in the same frame, in two adjacent pixels, the source terminal 32 of the transistor 30 of one pixel is charged with a positive $V_{L127}$ voltage, while the source terminal 32 of the transistor 30 of the other pixel is charged with a negative $V_{L127}$ voltage. That is, every two adjacent data lines 52 respectively provide voltages with opposite polarities to the source terminals 32 of the corresponding transistors 30.

Specifically, each of the transistors 30 illustrated in this embodiment represents one pixel. Two adjacent transistors 30 represent two adjacent pixels, wherein the source terminal 32 of one transistor 30 is first charged with the positive $V_{L127}$ voltage in a first frame. The scan signal is continuously stage-transferred from a first row. When the scan signal is transmitted to the gate line 40 of the current row, the first channel 3111 and the second channel 3121 of the transistor 30 are turned on, so that the drain terminal 33 is input with the same positive VL127 voltage as the source terminal 32. Subsequently, the gate line 40 is turned off, and the transistor 30 is in an off state. At this time, the source terminal 32 is input with a GND potential. The drain terminal 33 of the transistor 30 will leak current to the source terminal 32, resulting in lower pixel brightness. When entering the second frame, the source terminal 32 of the transistor 30 is first charged with the negative VL127 voltage, so that a voltage difference between the source terminal 32 and the drain terminal 33 of the transistor 30 increases, thereby accelerating leakage current of the drain terminal 33 and reducing the pixel brightness. When the scan signal scans the current row again, the first channel 3111 and the second channel 3121 of the transistor 30 are turned on, so that the drain terminal 33 is input with the same negative $V_{L127}$ voltage as the source terminal 32, thereby increasing the pixel brightness.

Correspondingly, in the first frame, the source terminal 32 of the other transistor 30 of the two adjacent transistors 30 is first charged with the negative $V_{L127}$ voltage, so that the transistor 30 is turned on, and the drain terminal 33 is input with the same negative $V_{L127}$ voltage as the source terminal 32. Subsequently, the gate line 40 is turned off, and the transistor 30 is in an off state. At this time, the source terminal 32 is input with the GND potential. When entering the second frame, the source terminal 32 of the transistor 30 is first charged with the positive $V_{L127}$ voltage.

In the two adjacent transistors 30, the source terminal 32 of one transistor 30 and the drain terminal 33 of the other adjacent transistor 30 correspond to one same light-shielding portion 20. The light-shielding portion 20 is separated from the source terminal 32 and the drain terminal 33 by the barrier layer 11. Therefore, a parasitic capacitance is formed between the light-shielding portion 20 and the source terminal 32, and another parasitic capacitance is formed between the light-shielding portion 20 and the drain terminal 33. In the two adjacent transistors 30, when one transistor 30 transitions from the first frame to the second frame, a potential of the source terminal 32 of the transistor 30 will jump from positive $V_{L127}$ to GND and from GND to negative $V_{L127}$. There is a parasitic capacitance between the light-shielding portion 20 and the source terminal 32, so that a potential of the light-shielding portion 20 will jump to negative. There is also a parasitic capacitance between the same light-shielding portion and the drain terminal 33 of the other transistor 30 in the two adjacent transistors 30. Negative jump of the light-shielding portion 20 will drive a voltage of the drain terminal 33 of the other transistor 30 to jump down, so that the drain terminal 33 of the other transistor 30 is coupled to the negative jump of the light-shielding portion 20, and its voltage also jumps to negative. At this time, the source terminal 32 of the other transistor 30 in the two adjacent transistors 30 is input with the negative $V_{L127}$ voltage. Correspondingly, a voltage of the drain terminal 33 of the transistor 30 is also negative. Therefore, when the drain terminal 33 is coupled to the negative jump of the light-shielding portion 20, an absolute value of the voltage of the drain terminal 33 will increase, which can compensate for a decrease in the absolute value of the voltage of the drain terminal 33 caused by the leakage current, thereby increasing the pixel brightness and improving the abnormal flicker caused by the leakage current of the transistors 30.

Figure 4:
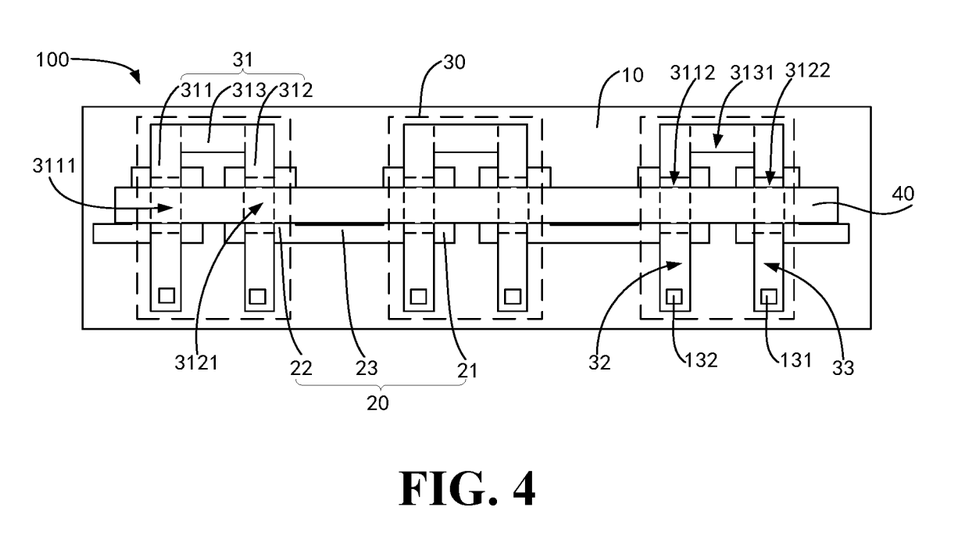
FIG. 4 is a schematic top view of another array substrate according to an embodiment of the present disclosure.

Please refer to FIG. 4. FIG. 4 is a schematic top view of another array substrate according to an embodiment of the present disclosure. This embodiment differs from the above embodiment in that each of the light-shielding portions 20 comprises a first light-shielding sub-portion 21, a second light-shielding sub-portion 22, and a third light-shielding sub-portion 23 connecting the first light-shielding sub-portion 21 and the second light-shielding sub-portion 22. The first light-shielding sub-portion 21 is disposed corresponding to the source terminal 32 and the first channel 3111. The second light-shielding sub-portion 22 is disposed corresponding to the drain terminal 33 and the second channel 3121. A width of the third light-shielding sub-portion 23 in the second direction Y is less than a width of the first light-shielding sub-portion 21 and a width of the second light-shielding sub-portion 22 in the second direction Y. An orthographic projection of each gate line 40 on the base substrate 10 does not overlap with an orthographic projection of one corresponding third light-shielding sub-portion 23 on the base substrate 10. Therefore, there is no overlap between each gate line 40 and the corresponding third light-shielding sub-portion 23, so as to reduce a parasitic capacitance between each gate line 40 and one corresponding light-shielding portion 20. For other details, reference may be made to the above embodiments which will not be described herein.

Figure 5:
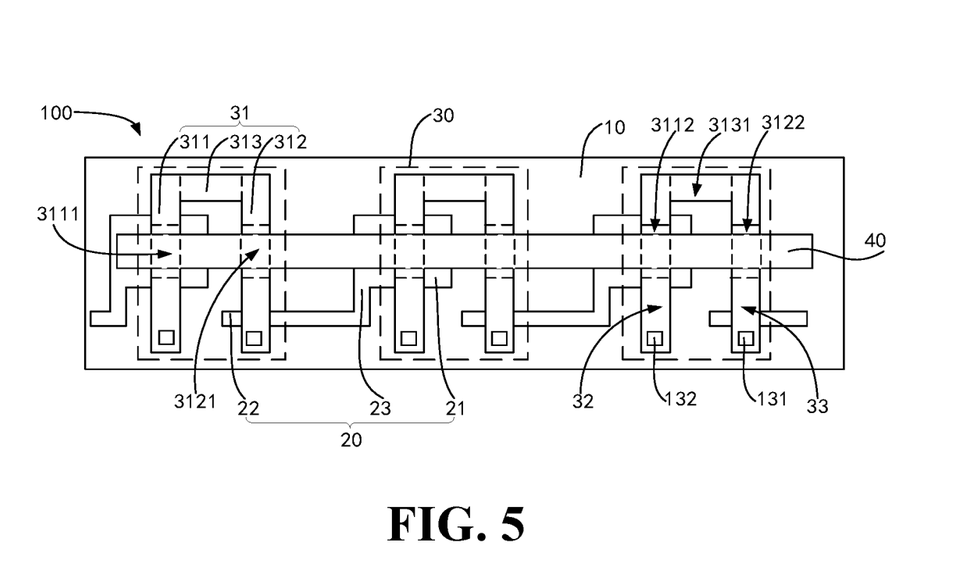
FIG. 5 is a schematic top view of still another array substrate according to an embodiment of the present disclosure.

Please refer to FIG. 5. FIG. 5 is a schematic top view of still another array substrate according to an embodiment of the present disclosure. This embodiment differs from the above embodiment in that one of the first channel 3111 of each of the transistors 30 and the second channel 3121 of the adjacent transistor 30 in the same row is disposed corresponding to one light-shielding portion 20. Each of the light-shielding portions 20 comprises a first light-shielding sub-portion 21, a second light-shielding sub-portion 22, and a third light-shielding sub-portion 23 connecting the first light-shielding sub-portion 21 and the second light-shielding sub-portion 22. The first light-shielding sub-portion 21 is disposed corresponding to the source terminal 32 and the first channel 3111. The second light-shielding sub-portion 22 is disposed corresponding to the drain terminal 33.

Figure 6:
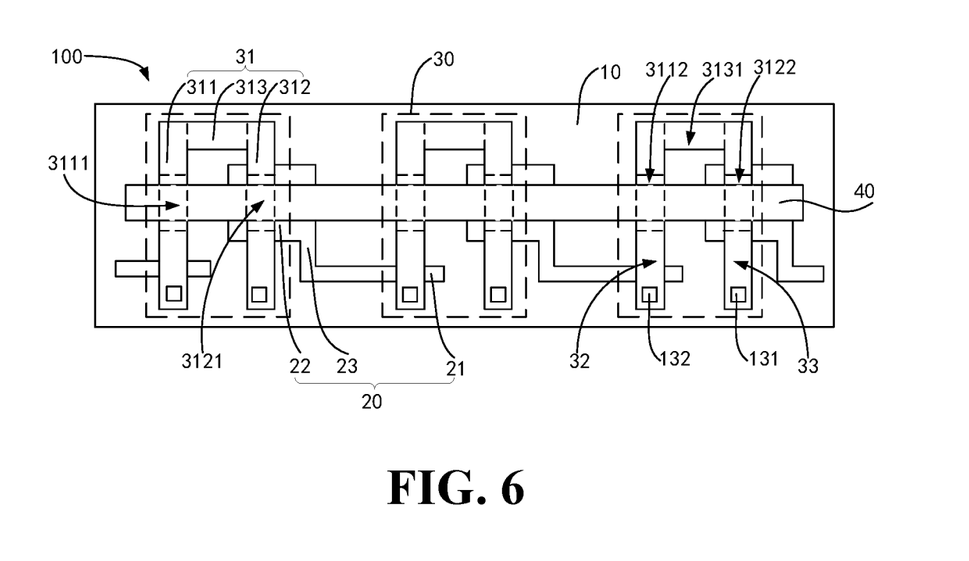
FIG. 6 is a schematic top view of yet another array substrate according to an embodiment of the present disclosure.

Alternatively, as shown in FIG. 6, which is a schematic top view of yet another array substrate according to an embodiment of the present disclosure, each of the light-shielding portions 20 comprises a first light-shielding sub-portion 21, a second light-shielding sub-portion 22, and a third light-shielding sub-portion 23 connecting the first light-shielding sub-portion 21 and the second light-shielding sub-portion 22. The first light-shielding sub-portion 21 is disposed corresponding to the source terminal 32. The second light-shielding sub-portion 22 is disposed corresponding to the second channel 3121 and the drain terminal 33. Therefore, each of the light-shielding portions 20 only shields one channel of two adjacent transistors 30. This avoids that when a distance between the source terminal 32 and the drain terminal 33 of the same transistor 30 is small, two adjacent light-shielding portions 20 may be connected together. For other details, reference may be made to the above embodiments which will not be described herein.

Figure 7:
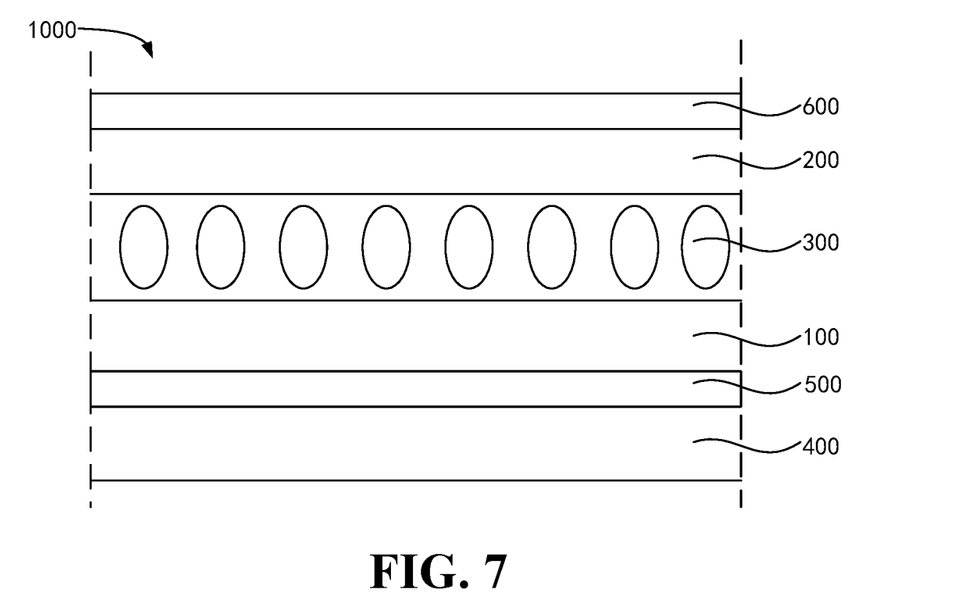
FIG. 7 is a schematic cross-sectional view of a display panel according to an embodiment of the present disclosure.

Please refer to FIG. 7. FIG. 7 is a schematic cross-sectional view of a display panel 1000 according to an embodiment of the present disclosure. The display panel 1000 comprises the array substrate 100 of one of the above embodiments. Optionally, the display panel 1000 may be an OLED display panel, a liquid crystal display panel, a QLED display panel, a QD-OLED display panel, or the like. When the display panel 1000 is an OLED display panel, the display panel 1000 further comprises a light-emitting function layer, an encapsulation layer, and the like, which are disposed on the array substrate 100.

When the display panel 1000 is a liquid crystal display panel, the display panel 1000 further comprises a color filter substrate 200 disposed opposite to the array substrate 100, liquid crystal molecules 300 disposed between the array substrate 100 and the color filter substrate 200, a backlight module 400 disposed on a side of the array substrate 100 away from the color filter substrate 200, a lower polarizer 500 disposed between the backlight module 400 and the array substrate 100, and an upper polarizer 600 disposed on a side of the color filter substrate 200 away from the array substrate 100. When the display panel 1000 is to implement functions such as touch control, the display panel 1000 may further comprise structures such as a touch control layer, which will not be described in detail herein.

According to the above embodiments, the following can be known.

The present disclosure provides an array substrate and a display panel comprising the same. The array substrate comprises a base substrate, a light-shielding layer disposed on the base substrate, and a plurality of transistors disposed in an array on a side of the light-shielding layer away from the base substrate. The light-shielding layer comprises a plurality of light-shielding portions disposed at intervals. Each of the transistors comprises an active layer, and the active layer comprises a source terminal and a drain terminal disposed at intervals. Orthographic projections of the source terminal of each of the transistors and the drain terminal of one adjacent transistor in a same row on the base substrate are located on one same light-shielding portion. Orthographic projections of the source terminal and the drain terminal of one same transistor on the base substrate are respectively located on two adjacent light-shielding portions that are spaced apart. In this way, a voltage jump at the source terminal of each transistor will cause a voltage jump at one corresponding light-shielding portion. The voltage jump at the corresponding light-shielding portion will be coupled to the drain terminal of one adjacent transistor. This increases an absolute value of a voltage of the drain terminal of the adjacent transistor to compensate for a decrease in a voltage at the drain terminal due to leakage current, thereby increasing pixel brightness and solving the technical problem of abnormal flicker of display panels caused by leakage current of transistors.

The embodiments of the present disclosure are described in detail above. The present disclosure uses specific examples to describe principles and embodiments of the present application. The above description of the embodiments is only for helping to understand the technical solutions of the present disclosure and its core ideas. It should be understood by those skilled in the art that they can modify the technical solutions recited in the foregoing embodiments, or replace some of technical features in the foregoing embodiments with equivalents. These modifications or replacements do not cause essence of corresponding technical solutions to depart from the scope of the technical solutions of the embodiments of the present disclosure.

What is claimed is:

1. An array substrate, comprising:

A base substrate;

A light-shielding layer disposed on the base substrate and comprising a plurality of light-shielding portions disposed at intervals;

A plurality of transistors disposed in an array on a side of the light-shielding layer away from the base substrate, wherein each of the transistors comprises an active layer, the active layer comprises a source terminal and a drain terminal disposed at intervals, orthographic projections of the source terminal of each of the transistors and the drain terminal of one adjacent transistor in a same row on the base substrate are located on one same light-shielding portion, and orthographic projections of the source terminal and the drain terminal of one same transistor on the base substrate are respectively located on two adjacent light-shielding portions that are spaced apart;

Wherein the transistors in each row further comprise a gate line disposed on a side of the active layers away from the light-shielding layer and extending in a first direction, each active layer comprises a first active portion and a second active portion disposed at intervals and extending in a second direction, and a third active portion connecting the first active portion and the second active portion, a region of the first active portion corresponding to the gate line is formed as a first channel, and a region of the second active portion corresponding to the gate line is formed as a second channel;

Wherein the source terminal is located at the first active portion and a side of the first channel away from the third active portion in the second direction, and the drain terminal is located at the second active portion and a side of the second channel away from the third active portion in the second direction;

Wherein, in a top view direction of the array substrate, the source terminal and the drain terminal are on a same side with respect to the gate line, Wherein the one same light shielding portion comprises a first sub-portion, a second sub-portion, and a third sub-portion, wherein an orthographic projection of the source terminal of each of the transistors is located on the first sub-portion, an orthographic projection of the drain terminal of one adjacent transistor in the same row on the base substrate is located on the second sub-portion, the third-sub-portion connects the first sub-portion and the second sub-portion, and an orthographic projection of the third sub-portion does not overlap with the gate line, and In the second direction, a width of the third sub-portion is narrower than a width of the first sub-portion or a width of the second sub-portion.

2. The array substrate according to claim 1, wherein the first channel of each of the transistors and the second channel of the adjacent transistor in the same row correspond to one same light-shielding portion.

3. The array substrate according to claim 2, wherein orthographic projections of the first channel of each of the transistors and the second channel of the adjacent transistor in the same row on the base substrate are located within an orthographic projection of the light-shielding portion on the base substrate.

4. The array substrate according to claim 2, wherein each of the light-shielding portions comprises a first light-shielding sub-portion, a second light-shielding sub-portion, and a third light-shielding sub-portion connecting the first light-shielding sub-portion and the second light-shielding sub-portion, the first light-shielding sub-portion is disposed corresponding to the source terminal and the first channel, and the second light-shielding sub-portion is disposed corresponding to the drain terminal and the second channel.

5. The array substrate according to claim 4, wherein a width of the third light-shielding sub-portion in the second direction is less than a width of the first light-shielding sub-portion and a width of the second light-shielding sub-portion in the second direction.

6. The array substrate according to claim 5, wherein an orthographic projection of each gate line on the base substrate does not overlap with an orthographic projection of one corresponding third light-shielding sub-portion on the base substrate.

7. The array substrate according to claim 1, wherein one of the first channel of each of the transistors and the second channel of the adjacent transistor in the same row is disposed corresponding to one light-shielding portion.

8. A display panel, comprising an array substrate, wherein the array substrate comprises:

A base substrate;

A light-shielding layer disposed on the base substrate and comprising a plurality of light-shielding portions disposed at intervals;

A plurality of transistors disposed in an array on a side of the light-shielding layer away from the base substrate, wherein each of the transistors comprises an active layer, the active layer comprises a source terminal and a drain terminal disposed at intervals, orthographic projections of the source terminal of each of the transistors and the drain terminal of one adjacent transistor in a same row on the base substrate at located on one same light-shielding portion, and orthographic projections of the source terminal and the drain terminal of one same transistor on the base substrate are respectively located on two adjacent light-shielding portions that are spaced apart;

Wherein the transistors in each row further comprise a gate line disposed on a side of the active layers away from the light-shielding layer and extending in a first direction, each active layer comprises a first active portion and a second active portion disposed at intervals and extending in a second direction, and a third active portion connecting the first active portion and the second active portion, a region of the first active portion corresponding to the gate line is formed as a first channel, and a region of the second active portion corresponding to the gate line is formed as a second channel;

Wherein the source terminal is located at the first active portion and a side of the first channel away from the third active portion in the second direction, and the drain terminal is located at the second active portion and a side of the second channel away from the third active portion in the second direction;

Wherein, in a top view direction of the array substrate, the source terminal and the drain terminal are on a same side with respect to the gate line, Wherein the one same light shielding portion comprises a first sub-portion, a second sub-portion, and a third sub-portion, wherein an orthographic projection of the source terminal of each of the transistors is located on the first sub-portion, an orthographic projection of the drain terminal of one adjacent transistor in the same row on the base substrate is located on the second sub-portion, the third-sub-portion connects the first sub-portion and the second sub-portion, and an orthographic projection of the third sub-portion does not overlap with the gate line, and In the second direction, a width of the third sub-portion is narrower than a width of the first sub-portion or a width of the second sub-portion.

9. The display panel according to claim 8, wherein the first channel of each of the transistors and the second channel of the adjacent transistor in the same row correspond to one same light-shielding portion.

10. The display panel according to claim 9, wherein orthographic projections of the first channel of each of the transistors and the second channel of the adjacent transistor in the same row on the base substrate is located within an orthographic projection of the light-shielding portion on the base substrate.

11. The display panel according to claim 9, wherein each of the light-shielding portions comprises a first light-shielding sub-portion, a second light-shielding sub-portion, and a third light-shielding sub-portion connecting the first light-shielding sub-portion and the second light-shielding sub-portion, the first light-shielding sub-portion is disposed corresponding to the source terminal and the first channel, and the second light-shielding sub-portion is disposed corresponding to the drain terminal and the second channel.

12. The display panel according to claim 11, wherein a width of the third light-shielding sub-portion in the second direction is less than a width of the first light-shielding sub-portion and a width of the second light-shielding sub-portion in the second direction.

13. The display panel according to claim 12, wherein an orthographic projection of each gate line on the base substrate does not overlap with an orthographic projection of one corresponding third light-shielding sub-portion on the base substrate.

14. The display panel according to claim 8, wherein one of the first channel of each of the transistors and the second channel of the adjacent transistor in the same row is disposed corresponding to one light-shielding portion.

* * * * *